United States Patent
Volkovich et al.

(10) Patent No.: US 11,551,980 B2
(45) Date of Patent: Jan. 10, 2023

(54) DYNAMIC AMELIORATION OF MISREGISTRATION MEASUREMENT

(71) Applicant: KLA-TENCOR CORPORATION, Milpitas, CA (US)

(72) Inventors: Roie Volkovich, Hadera (IL); Anna Golotsvan, Qiryat Tivon (IL); Eyal Abend, Haifa (IL)

(73) Assignee: KLA-TENCOR CORPORATION, Milpitas, CA (US)

( * ) Notice: Subject to any disclaimer, the term of this patent is extended or adjusted under 35 U.S.C. 154(b) by 119 days.

(21) Appl. No.: 16/470,886

(22) PCT Filed: May 19, 2019

(86) PCT No.: PCT/US2019/033019
§ 371 (c)(1),
(2) Date: Jun. 18, 2019

(87) PCT Pub. No.: WO2020/185242
PCT Pub. Date: Sep. 17, 2020

(65) Prior Publication Data
US 2020/0286794 A1  Sep. 10, 2020

Related U.S. Application Data

(60) Provisional application No. 62/815,990, filed on Mar. 8, 2019.

(51) Int. Cl.
*H01L 21/66* (2006.01)
*H01L 21/67* (2006.01)
*G01B 11/27* (2006.01)

(52) U.S. Cl.
CPC .......... *H01L 22/12* (2013.01); *G01B 11/272* (2013.01); *H01L 21/67288* (2013.01); *G01B 2210/56* (2013.01)

(58) Field of Classification Search
CPC . H01L 22/12; H01L 21/67288; G01B 11/272; G01B 2210/56
See application file for complete search history.

(56) References Cited

U.S. PATENT DOCUMENTS 10,095,122 B1 * 10/2018 Lee ........................... G03F 1/76
2005/0018289 A1 * 1/2005 Yanowitz ........... G02B 27/0025
359/462

(Continued)

FOREIGN PATENT DOCUMENTS

JP          4620048 B2       1/2011

OTHER PUBLICATIONS

WIPO, ISR for PCT/US2019/033019, Dec. 6, 2019.

*Primary Examiner* — Jamil Ahmed
(74) *Attorney, Agent, or Firm* — Hodgson Russ LLP

(57) ABSTRACT

A dynamic misregistration measurement amelioration method including taking at least one misregistration measurement at multiple sites on a first semiconductor device wafer, which is selected from a batch of semiconductor device wafers intended to be identical, analyzing each of the misregistration measurements, using data from the analysis of each of the misregistration measurements to determine ameliorated misregistration measurement parameters at each one of the multiple sites, thereafter ameliorating misregistration metrology tool setup for ameliorated misregistration measurement at the each one of the multiple sites, thereby generating an ameliorated misregistration metrology tool setup and thereafter measuring misregistration at multiple sites on a second semiconductor device wafer, which is selected from the batch of semiconductor device wafers intended to be identical, using the ameliorated misregistration metrology tool setup.

23 Claims, 2 Drawing Sheets

(56) References Cited

U.S. PATENT DOCUMENTS

| | | |
|---|---|---|
| 2006/0113556 A1 | 6/2006 | Hughes |
| 2011/0051150 A1 | 3/2011 | Choi et al. |
| 2014/0060148 A1* | 3/2014 | Amit .................... G01B 21/042 |
| | | 73/1.79 |
| 2017/0255188 A1 | 9/2017 | Izikson et al. |
| 2017/0256501 A1 | 9/2017 | Chao et al. |
| 2017/0343903 A1* | 11/2017 | Lee ........................... G03F 1/38 |
| 2018/0196358 A1* | 7/2018 | Lee ..................... G03F 7/70091 |

* cited by examiner

DYNAMIC AMELIORATION OF MISREGISTRATION MEASUREMENT

REFERENCE TO RELATED APPLICATIONS

Reference is made to U.S. Provisional Patent Application Ser. No. 62/815,990, filed Mar. 8, 2019 and entitled IMPROVE OVERLAY RESULTS BY DYNAMIC MEASUREMENTS, the disclosure of which is hereby incorporated by reference and priority of which is hereby claimed.

FIELD OF THE INVENTION

The present invention relates to the field of metrology, and more particularly, to metrology recipe setup and measurement procedures.

BACKGROUND OF THE INVENTION

Various types of devices and procedures for metrology and metrology recipe setup are known.

SUMMARY OF THE INVENTION

The present invention seeks to provide improved methods and systems for metrology.

There is thus provided in accordance with a preferred embodiment of the present invention a dynamic misregistration measurement amelioration method including taking at least one misregistration measurement at multiple sites on a first semiconductor device wafer, which is selected from a batch of semiconductor device wafers intended to be identical, analyzing each of the misregistration measurements, using data from the analysis of each of the misregistration measurements to determine ameliorated misregistration measurement parameters at each one of the multiple sites, thereafter ameliorating misregistration metrology tool setup for ameliorated misregistration measurement at the each one of the multiple sites, thereby generating an ameliorated misregistration metrology tool setup and thereafter measuring misregistration at multiple sites on a second semiconductor device wafer, which is selected from the batch of semiconductor device wafers intended to be identical, using the ameliorated misregistration metrology tool setup.

In accordance with a preferred embodiment of the present invention the misregistration measurements are taken with an imaging misregistration metrology tool. Additionally, the misregistration metrology tool setup includes at least one of the following: a region of interest in a metrology target, a wavelength of light used in misregistration measurement, a polarization of light used in misregistration measurement and a numerical aperture.

In accordance with a preferred embodiment of the present invention the misregistration measurements are taken with a scatterometry misregistration metrology tool. Additionally, the misregistration metrology tool setup includes at least one of the following: a polarization of light used in misregistration measurement, a diffraction mask used in misregistration measurement and a diffraction aperture used in misregistration measurement.

Preferably, the method does not decrease processing throughput.

In accordance with a preferred embodiment of the present invention the dynamic misregistration measurement amelioration method also includes recalculating results of the at least one misregistration measurement using the ameliorated misregistration measurement parameters at the each one of multiple sites.

In accordance with a preferred embodiment of the present invention the first semiconductor device wafer and the second semiconductor device wafer are the same semiconductor device wafer.

Preferably, the misregistration metrology tool setup is selected based on at least one of: increased contrast precision of results of the misregistration measurements, improved residual values of results of the misregistration measurements, better correlation between results of the misregistration measurements and electron beam measurements, improved device yield, improved, precision of results of the misregistration measurements, reduced tool-induced-shift of results of the misregistration measurements, improved sensitivity of results of the misregistration measurements, improved throughput of the misregistration measurements, improved matching of results of the misregistration measurements to results of misregistration measurements taken by other misregistration metrology tools and decreased fluctuations in results of the misregistration measurements with process variations.

There is also provided in accordance with a preferred embodiment of the present invention a dynamic misregistration measurement amelioration system including a misregistration metrology tool operative to perform the dynamic optimization misregistration method.

There is further provided in accordance with yet another preferred embodiment of the present invention a dynamic misregistration measurement amelioration method including taking at least one misregistration measurement at multiple sites on a semiconductor device wafer, which is selected from a batch of semiconductor device wafers intended to be identical, analyzing each of the misregistration measurements, using data from the analysis of each of the misregistration measurements to determine ameliorated site-specific misregistration parameters each one of multiple sites, thereafter ameliorating a setup for misregistration measurement at the each one of multiple sites, thereby generating an ameliorated misregistration metrology tool setup and thereafter remeasuring misregistration of the semiconductor device wafer, which is selected from a batch of semiconductor device wafers intended to be identical, using the ameliorated misregistration metrology tool setup.

In accordance with a preferred embodiment of the present invention the misregistration measurements are taken with an imaging misregistration metrology tool. Additionally, the misregistration metrology tool setup includes at least one of the following: a region of interest in metrology target, a wavelength of light used in misregistration measurement, a polarization of light used in misregistration measurement and a numerical aperture.

In accordance with a preferred embodiment of the present invention the misregistration measurements are taken with a scatterometry misregistration metrology tool. Additionally, the misregistration metrology tool setup includes at least one of the following: a polarization of light used in misregistration measurement, a diffraction mask used in misregistration measurement and a diffraction aperture used in misregistration measurement.

Preferably, the method does not decrease processing throughput.

In accordance with a preferred embodiment of the present invention the dynamic misregistration measurement amelioration method also includes recalculating results of the at least one misregistration measurement using the ameliorated misregistration measurement parameters at the each one of multiple sites.

In accordance with a preferred embodiment of the present invention the dynamic misregistration measurement amelioration method also includes measuring misregistration at multiple sites on a second semiconductor device wafer, which is selected from the batch of semiconductor device wafers intended to be identical, using the ameliorated misregistration metrology tool setup.

Preferably, the misregistration metrology tool setup is selected based on at least one of: increased contrast precision of results of the misregistration measurements, improved residual values of results of the misregistration measurements, better correlation between results of the misregistration measurements and electron beam measurements, improved device yield, improved precision of results of the misregistration measurements, reduced tool-induced-shift of results of the misregistration measurements, improved sensitivity of results of the misregistration measurements, improved throughput of the misregistration measurements, improved matching of results of the misregistration measurements to results of misregistration measurements taken by other misregistration metrology tools and decreased fluctuations in results of the misregistration measurements with process variations.

There is also provided in accordance with a preferred embodiment of the present invention a dynamic misregistration measurement amelioration system including a misregistration metrology tool operative to perform the dynamic optimization misregistration method.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
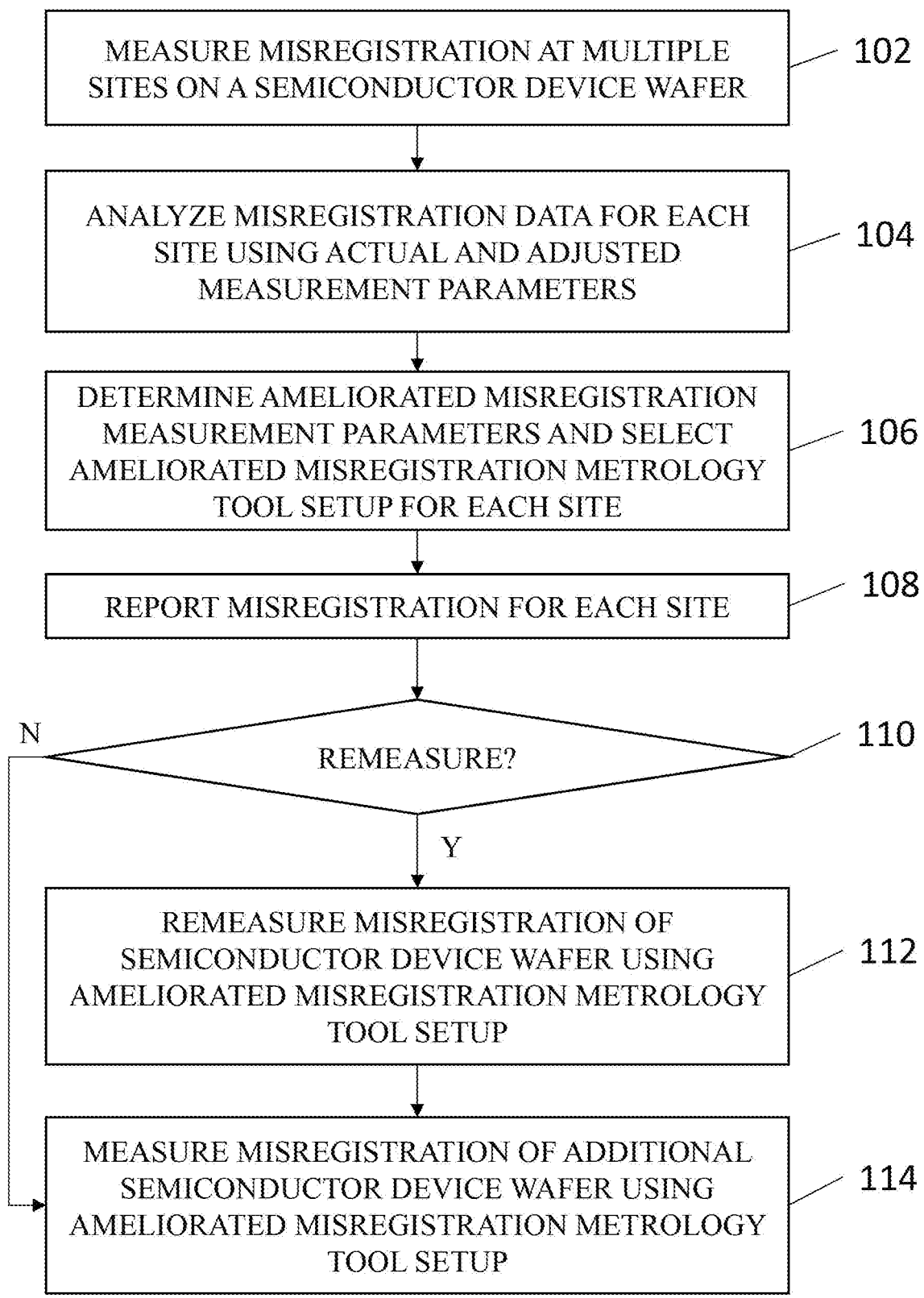
FIG. 1 is a simplified flowchart illustrating a dynamic misregistration measurement amelioration method.

Reference is now made to FIG. 1, which is a simplified flowchart illustrating a dynamic misregistration measurement amelioration method. As seen at a first step 102, misregistration is measured at multiple sites on a semiconductor device wafer, which is selected from a batch of semiconductor device wafers intended to be identical. The number of sites measured on a semiconductor device wafer can range from 2-4,000 sites.

It is appreciated that misregistration measurements at each of the multiple sites taken at step 102 may consist either of a single grab or of multiple grabs. It is further appreciated that misregistration measurements taken at each of the multiple sites at step 102 may be measured using a single misregistration metrology tool setup, or multiple alternative misregistration metrology tool setups.

At step 102, misregistration may be measured using any suitable misregistration metrology tool, including, inter alia, an imaging misregistration metrology tool or a scatterometry misregistration metrology tool. A typical imaging misregistration metrology tool useful in step 102 is an Archer™ 600, commercially available from KLA-Tencor Corporation of Milpitas, Calif., USA. A typical scatterometry metrology tool useful in step 102 is an ATL™ 100, commercially available from KLA-Tencor Corporation of Milpitas, Calif., USA.

At a next step 104, the misregistration data for each site measured at step 102 is analyzed. The analysis of step 104 may include analysis based both on misregistration measurement parameters used in the measurements taken at step 102 and on adjusted misregistration measurement parameters.

Adjusted misregistration measurement parameters include at least one measurement parameter that is different from misregistration measurement parameters used in the measurements taken at step 102. For example, measurements may be analyzed based both on the entire region of interest (ROI) used in the measurements taken at step 102, and on sub-sections of the ROT used in the measurements taken at step 102.

Based on the analysis at step 104, at a next step 106, ameliorated misregistration measurement parameters are selected for each one of multiple sites measured at step 102 and an ameliorated misregistration metrology tool setup is selected for each measurement site. It is appreciated that an ameliorated misregistration metrology tool setup can be selected to satisfy various criteria, including, inter alia, increased contrast precision of results of misregistration measurements, improved residual values of results of misregistration measurements, better correlation between results of misregistration measurements and electron beam measurements; improved device yield, improved precision of results of misregistration measurements, reduced tool-induced-shift of results of misregistration measurements, improved sensitivity of results of misregistration measurements, improved throughput of misregistration measurements, improved matching of results of misregistration measurements to results of misregistration measurements taken by other misregistration metrology tools and decreased fluctuations in results of misregistration measurements with process variations.

In a preferred embodiment of the present invention, ameliorated misregistration measurement parameters include fewer variations than misregistration measurement parameters used in the measurements taken at step 102. For example, measurements may be taken at step 102 with multiple wavelengths of light, only one of which is included in the adjusted misregistration measurement parameters. Similarly, measurements may be taken at step 102 with multiple polarizations of light, only one of which is included in the adjusted misregistration measurement parameters. Similarly, measurements may be taken at step 102 with multiple numerical apertures, only one of which is included in the adjusted misregistration measurement parameters.

Additionally, ameliorated misregistration measurement parameters may be different than misregistration measurement parameters used in the measurements taken at step 102. For example, measurements may be taken at step 102 using a relatively large ROI, and the ameliorated misregistration measurement parameters may include only certain sub-sections of the ROI used in the measurements taken at step 102.

If an imaging misregistration metrology tool is employed, misregistration measurement parameters adjusted between step 102 and step 106 may include, inter alia, a region of interest in a metrology target, a wavelength of light used in a misregistration measurement, polarization of light used in misregistration measurement and numerical aperture.

If a scatterometry misregistration metrology tool is employed, misregistration measurement parameters adjusted between step 102 and step 106 may include, inter alia, polarization of light used in misregistration measurement, diffraction mask used in misregistration measurement and diffraction aperture used in misregistration measurement.

As seen at a next step 108, a misregistration value is obtained for each site measured at step 102. In a preferred embodiment of the present invention, step 108 uses the ameliorated misregistration measurement parameters for each site selected at step 106 to calculate misregistration values for each site measured at step 102. For example, misregistration measurements taken at step 102 using a relatively large ROI may be recalculated using the ameliorated ROI selected at step 106.

As seen at a next step 110, it is ascertained whether the semiconductor device wafer whose misregistration was measured at step 102 should be remeasured using the ameliorated misregistration metrology tool setup selected at step 106. If the previously measured semiconductor device wafer should be remeasured, for example if the previously measured semiconductor device wafer was measured at relatively few sites at step 102, in a next step 112 the same semiconductor device wafer whose misregistration was measured at step 102 is remeasured using the ameliorated misregistration metrology tool setup selected at step 106.

Following step 112, or directly following step 110 if the semiconductor device wafer whose misregistration was measured at step 102 does not require remeasurement, in a further step 114, misregistration is measured at multiple sites on at least one other semiconductor device wafer, which is selected from the same batch of semiconductor device wafers from which the semiconductor device wafer whose misregistration was measured at step 102 was selected. It is a particular feature of an embodiment of the present invention that misregistration measured at step 114 is measured using the ameliorated misregistration metrology tool setup selected at step 106.

It is a particular feature of an embodiment of the present invention that measurements analyzed at step 104 and used for amelioration of misregistration metrology tool setup are measurements that would ordinarily be taken in the course of ascertaining the misregistration of various semiconductor device wafers in the batch of semiconductor device wafers which are designed to be identical. Thus, the method of the present invention does not decrease processing throughput.

Figure 2:
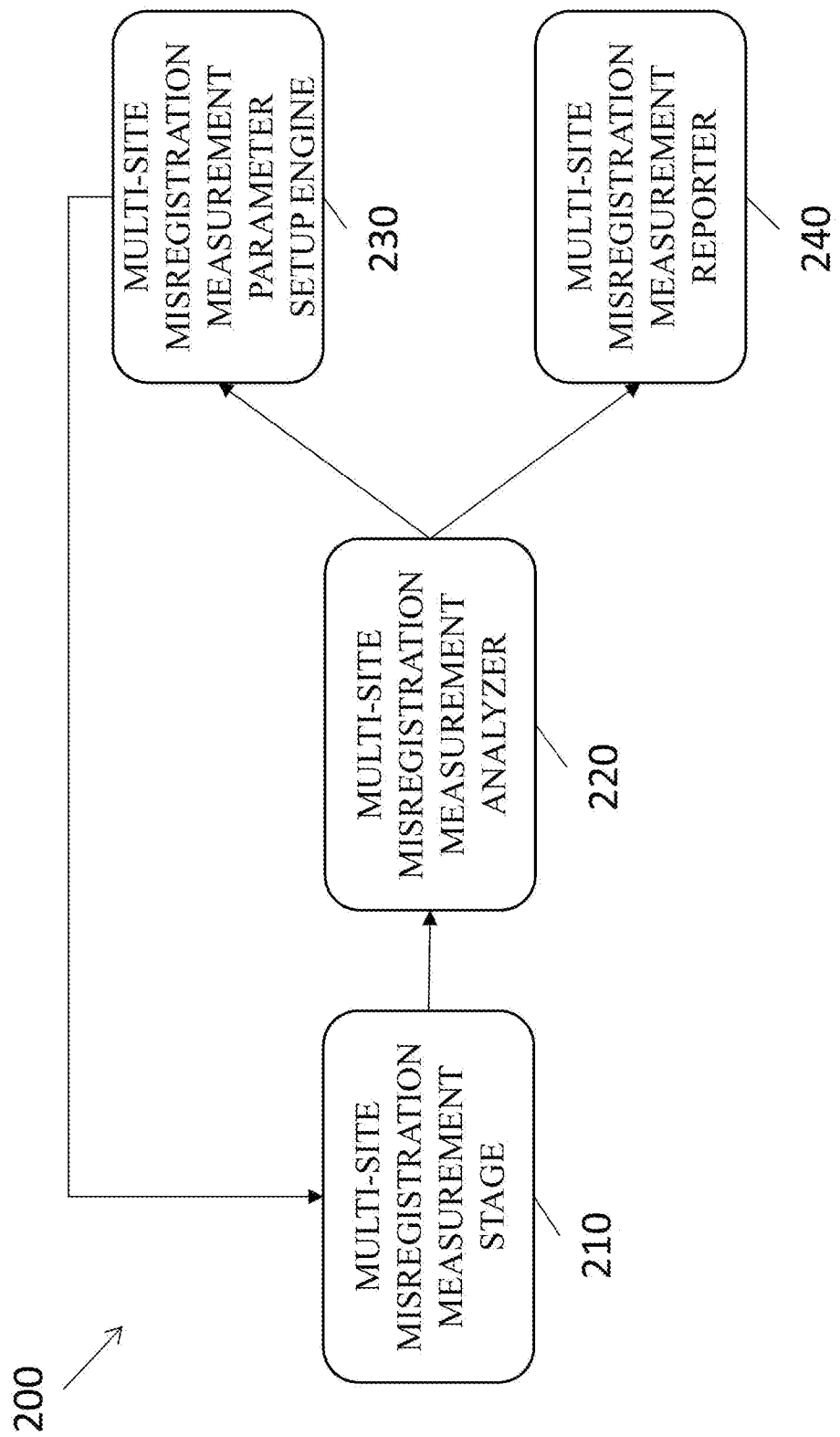
FIG. 2 is a simplified schematic pictorial illustration of a dynamic misregistration measurement amelioration system useful in performing the method of FIG. 1.

Reference is now made to FIG. 2, which is a simplified schematic pictorial illustration of a dynamic misregistration measurement amelioration system 200 useful in performing the method described hereinabove with reference to FIG. 1. As seen in FIG. 2, dynamic misregistration measurement amelioration system 200 includes a multi-site misregistration measurement stage 210, operative to measure misregistration at multiple sites on a semiconductor device wafer.

Multi-site misregistration measurement stage 210 may include any suitable misregistration metrology tool, including, inter alia, an imaging misregistration metrology tool or a scatterometry misregistration metrology tool. A typical imaging misregistration metrology tool useful in multi-site misregistration measurement stage 210 is an Archer™ 600, commercially available from KLA-Tencor Corporation of Milpitas, Calif., USA. A typical scatterometry metrology tool useful in multi-site misregistration measurement stage 210 is an ATL™ 100, commercially available from KLA-Tencor Corporation of Milpitas, Calif., USA.

Multi-site misregistration measurement stage 210 is operative to communicate results of misregistration measurements to multi-site misregistration measurement analyzer 220. Multi-site misregistration measurement analyzer 220 is operative, to analyze misregistration data provided by multi-site misregistration measurement stage 210 based both on misregistration measurement parameters used in the measurements taken by multi-site misregistration measurement stage 210 and on adjusted misregistration measurement parameters.

Adjusted misregistration measurement parameters include at least one measurement parameter that is different from misregistration measurement parameters used in the measurements taken by multi-site misregistration measurement stage 210. For example, measurements may be analyzed based both on the entire ROI used in the measurements taken by multi-site misregistration measurement stage 210, and on sub-sections of the ROI used in the measurements taken by multi-site misregistration measurement stage 210.

Multi-site misregistration measurement analyzer 220 is further operative to communicate the results of its analysis to multi-site misregistration measurement parameter setup engine 230. Multi-site misregistration measurement parameter setup engine 230 is operative to select ameliorated misregistration measurement parameters for each one of multiple sites measured by multi-site misregistration measurement stage 210 and to select an ameliorated misregistration metrology tool setup for each measurement site. Multi-site misregistration measurement parameter setup engine 230 is further operative to communicate the ameliorated misregistration metrology tool setup to multi-site misregistration measurement stage 210.

The ameliorated misregistration metrology tool setup selected by multi-site misregistration measurement parameter setup engine 230 may satisfy various criteria, including, inter alia, increased contrast precision of results of misregistration measurements, improved residual values of results of misregistration measurements, better correlation between results of misregistration measurements and electron beam measurements; improved device yield, improved precision of results of misregistration measurements, reduced tool-induced-shift of results of misregistration measurements, improved sensitivity of results of misregistration measurements, improved throughput of misregistration measurements, improved matching of results of misregistration measurements to results of misregistration measurements taken by other misregistration metrology tools and decreased fluctuations in results of misregistration measurements with process variations.

In a preferred embodiment of the present invention, ameliorated misregistration measurement parameters include fewer variations than misregistration measurement parameters used initially in the measurements taken by multi-site misregistration measurement stage 210. For example, measurements may initially be taken by multi-site misregistration measurement stage 210 with multiple wavelengths of light, only one of which is included in the adjusted misregistration measurement parameters selected by multi-site misregistration measurement parameter setup engine 230.

Similarly, measurements may initially be taken by multi-site misregistration measurement stage 210 with multiple polarizations of light, only one of which is included in the adjusted misregistration measurement parameters selected by multi-site misregistration measurement parameter setup engine 230. Similarly, measurements may initially be taken by multi-site misregistration measurement stage 210 with multiple numerical apertures, only one of which is included in the adjusted misregistration measurement parameters selected by multi-site misregistration measurement parameter setup engine 230.

Additionally, ameliorated misregistration measurement parameters selected by multi-site misregistration measurement parameter setup engine 230 may be different than misregistration measurement parameters used in the initial measurements taken by multi-site misregistration measurement stage 210. For example, measurements may initially be taken by multi-site misregistration measurement stage 210 using a relatively large ROI, and the ameliorated misregistration measurement parameters selected by multi-site misregistration measurement parameter setup engine 230 may include only certain sub-sections of the ROI used in the measurements initially taken by multi-site misregistration measurement stage 210.

If multi-site misregistration measurement stage 210 includes an imaging misregistration metrology tool, misregistration measurement parameters adjusted by multi-site misregistration measurement parameter setup engine 230 may include, inter alia, a region of interest in a metrology target, a wavelength of light used in a misregistration measurement, polarization of light used in misregistration measurement and numerical aperture.

If multi-site misregistration measurement stage 210 includes a scatterometry misregistration metrology tool, misregistration measurement parameters adjusted by multi-site misregistration measurement parameter setup engine 230 may include, inter alia, polarization of light used in misregistration measurement, diffraction mask used in misregistration measurement and diffraction aperture used in misregistration measurement.

Multi-site misregistration measurement analyzer 220 is further operative to communicate the results of its analysis to multi-site misregistration measurement reporter 240. Multi-site misregistration measurement reporter 240 is operative to output a misregistration value for each site measured by multi-site misregistration measurement stage 210.

In a preferred embodiment of the present invention, multi-site misregistration measurement reporter 240 uses the ameliorated misregistration measurement parameters for each site selected by multi-site misregistration measurement parameter setup engine 230 to calculate misregistration values for each site measured by multi-site misregistration measurement stage 210. For example misregistration measurements taken by multi-site misregistration measurement stage 210 using a relatively large ROI may be recalculated using the ameliorated ROI selected by multi-site misregistration measurement parameter setup engine 230.

It will be appreciated by persons skilled in the art that the present invention is not limited to what has been particularly shown and described hereinabove. The scope of the present invention includes both combinations and sub combinations of various features described hereinabove as well as modifications thereof, all of which are not in the prior art.

The invention claimed is:

1. A dynamic misregistration measurement amelioration method comprising:
  taking at least one misregistration measurement at multiple sites on a first semiconductor device wafer using a region of interest in a metrology target on the semiconductor device wafer, which is selected from a batch of semiconductor device wafers intended to be identical, wherein said misregistration measurements are taken with an imaging misregistration metrology tool;
  analyzing each of said misregistration measurements;
  using data from said analysis of each of said misregistration measurements to determine ameliorated misregistration measurement parameters at each one of said multiple sites, wherein the ameliorated misregistration measurement parameters include only sub-sections of said region of interest;
  thereafter ameliorating misregistration metrology tool setup for ameliorated misregistration measurement at said each one of said multiple sites, thereby generating an ameliorated misregistration metrology tool setup, wherein said misregistration measurements are taken with said imaging misregistration metrology tool and said misregistration metrology tool setup comprises a wavelength of light used in misregistration measurement or a numerical aperture; and
  thereafter measuring misregistration at a sub-section of said region of interest at multiple sites on a second semiconductor device wafer, which is selected from said batch of semiconductor device wafers intended to be identical, using said ameliorated misregistration metrology tool setup.

2. The method of claim 1, further comprising recalculating results of said at least one misregistration measurement using said ameliorated misregistration measurement parameters at said each one of multiple sites.

3. The method of claim 1, wherein said first semiconductor device wafer and said second semiconductor device wafer are the same semiconductor device wafer.

4. The method of claim 1, wherein said misregistration metrology tool setup is selected based on at least one of:
  increased contrast precision of results of said misregistration measurements;
  improved residual values of results of said misregistration measurements;
  better correlation between results of said misregistration measurements and electron beam measurements;
  improved device yield;
  improved precision of results of said misregistration measurements;
  reduced tool-induced-shift of results of said misregistration measurements;
  improved sensitivity of results of said misregistration measurements;
  improved throughput of said misregistration measurements;
  improved matching of results of said misregistration measurements to results of misregistration measurements taken by other misregistration metrology tools; or
  decreased fluctuations in results of said misregistration measurements with process variations.

5. A dynamic misregistration measurement amelioration system comprising a misregistration metrology tool operative to perform the dynamic misregistration measurement amelioration method of claim 1.

6. A dynamic misregistration measurement amelioration method comprising:
  taking at least one misregistration measurement at multiple sites on a semiconductor device wafer using a region of interest in a metrology target on the semiconductor device wafer, which is selected from a batch of semiconductor device wafers intended to be identical, wherein said misregistration measurements are taken with an imaging misregistration metrology tool;
  analyzing each of said misregistration measurements;

using data from said analysis of each of said misregistration measurements to determine ameliorated site-specific misregistration parameters at each one of multiple sites, wherein the ameliorated misregistration measurement parameters include only sub-sections of said region of interest;

thereafter ameliorating a setup for misregistration measurement at said each one of multiple sites, thereby generating an ameliorated misregistration metrology tool setup, wherein said misregistration measurements are taken with said imaging misregistration metrology tool and said misregistration metrology tool setup comprises a wavelength of light used in misregistration measurement or a numerical aperture; and thereafter remeasuring misregistration of said semiconductor device wafer, which is selected from said batch of semiconductor device wafers intended to be identical, at a sub-section of said region of interest using said ameliorated misregistration metrology tool setup.

7. The method of claim 6, further comprising recalculating results of said at least one misregistration measurement using said ameliorated misregistration measurement parameters at said each one of multiple sites.

8. The method of claim 6, further comprising measuring misregistration at multiple sites on a second semiconductor device wafer, which is selected from said batch of semiconductor device wafers intended to be identical, using said ameliorated misregistration metrology tool setup.

9. The method of claim 6, wherein said misregistration metrology tool setup is selected based on increased contrast precision of results of said misregistration measurements.

10. A dynamic misregistration measurement amelioration system comprising a misregistration metrology tool operative to perform the dynamic misregistration measurement amelioration method of claim 6.

11. A dynamic misregistration measurement amelioration system comprising a misregistration metrology tool operative to perform the dynamic misregistration measurement amelioration method of claim 7.

12. The method of claim 6, wherein said misregistration metrology tool setup is selected based on improved residual values of results of said misregistration measurements.

13. The method of claim 6, wherein said misregistration metrology tool setup is selected based on better correlation between results of said misregistration measurements and electron beam measurements.

14. The method of claim 6, wherein said misregistration metrology tool setup is selected based on improved device yield.

15. The method of claim 6, wherein said misregistration metrology tool setup is selected based on improved precision of results of said misregistration measurements.

16. The method of claim 6, wherein said misregistration metrology tool setup is selected based on reduced tool-induced-shift of results of said misregistration measurements.

17. The method of claim 6, wherein said misregistration metrology tool setup is selected based on improved sensitivity of results of said misregistration measurements.

18. The method of claim 6, wherein said misregistration metrology tool setup is selected based on improved throughput of said misregistration measurements.

19. The method of claim 6, wherein said misregistration metrology tool setup is selected based on improved matching of results of said misregistration measurements to results of misregistration measurements taken by other misregistration metrology tools.

20. The method of claim 6, wherein said misregistration metrology tool setup is selected based on decreased fluctuations in results of said misregistration measurements with process variations.

21. The method of claim 6, wherein said at least one misregistration measurement at multiple sites on a semiconductor device wafer uses multiple polarizations of light and wherein said remeasuring misregistration of said semiconductor device wafer uses only one of the polarizations of light.

22. The method of claim 6, wherein said at least one misregistration measurement at multiple sites on a semiconductor device wafer uses multiple of said numerical apertures and wherein said remeasuring misregistration of said semiconductor device wafer uses only one of the numerical apertures.

23. The method of claim 6, wherein said misregistration metrology tool setup further comprises a polarization of light used in misregistration measurement.

\* \* \* \* \*